United States Patent
To et al.

(10) Patent No.: US 10,714,240 B2
(45) Date of Patent: Jul. 14, 2020

(54) OVERVOLTAGE PROTECTION DEVICE

(71) Applicant: Littelfuse Semiconductor (Wuxi) Co., Ltd, Wuxi (CN)

(72) Inventors: Teddy C. T. To, Hong Kong (HK); Chuanfang Chin, Taoyuan (CN); Yaosheng Du, Beijing (CN)

(73) Assignee: Littlefuse Semiconductor (Wuxi) Co., Ltd., Wuxi, Jiangsu Province (CN)

( * ) Notice: Subject to any disclaimer, the term of this patent is extended or adjusted under 35 U.S.C. 154(b) by 352 days.

(21) Appl. No.: 15/751,656

(22) PCT Filed: Aug. 13, 2015

(86) PCT No.: PCT/CN2015/086834
§ 371 (c)(1),
(2) Date: Feb. 9, 2018

(87) PCT Pub. No.: WO2017/024577
PCT Pub. Date: Feb. 16, 2017

(65) Prior Publication Data
US 2018/0240575 A1    Aug. 23, 2018

(51) Int. Cl.
*H02H 9/00* (2006.01)
*H01C 7/102* (2006.01)
(Continued)

(52) U.S. Cl.
CPC ............... *H01C 7/102* (2013.01); *H01C 7/12* (2013.01); *H02H 9/04* (2013.01); *H02H 9/041* (2013.01); *H02H 9/044* (2013.01); *H01L 29/87* (2013.01)

(58) Field of Classification Search
None
See application file for complete search history.

(56) References Cited

U.S. PATENT DOCUMENTS 4,975,674 A    12/1990   Sumiyoshi et al.
5,569,609 A    10/1996   Salbreux
(Continued)

FOREIGN PATENT DOCUMENTS

CA       963167 A       2/1975
CN    201393063 Y       1/2010
(Continued)

OTHER PUBLICATIONS

European Search Report and Written Opinion for the European Patent Application No. EP15900775, dated Mar. 27, 2019, 5 pages.
(Continued)

*Primary Examiner* — Stephen W Jackson

(57) ABSTRACT

An overvoltage protection device (100) may include a metal oxide varistor (MOV) (102) having a first surface (114) and a second surface (116); a semiconductor substrate (202) having a first outer surface (126) and a second outer surface (128) and comprising a semiconductor crowbar device (104) comprising a plurality of semiconductor layers arranged in electrical series to one another, the semiconductor substrate (202) being disposed on a first side of the metal oxide varistor (102), a conductive region (124) disposed between the second surface (116) of the MOV (102) and the first outer surface (126) of the semiconductor substrate (202); a first electrical contact (120) disposed on the first surface (114) of the MOV (102); and a second electrical contact (122) disposed on the second outer surface (128) of the semiconductor substrate (202).

17 Claims, 9 Drawing Sheets

(51) Int. Cl.
*H01C 7/12* (2006.01)
*H02H 9/04* (2006.01)
*H01L 29/87* (2006.01)

(56) References Cited

U.S. PATENT DOCUMENTS

| | | | |
|---|---|---|---|
| 5,982,597 A | 11/1999 | Webb | |
| 7,405,431 B2 * | 7/2008 | Aoyagi | H01L 25/167 257/79 |
| 7,660,096 B2 | 2/2010 | Golubovic et al. | |
| 9,093,831 B2 * | 7/2015 | Goodson | H02G 13/80 |
| 2008/0258858 A1 | 10/2008 | Sun | |
| 2009/0027153 A1 | 1/2009 | Ho | |

FOREIGN PATENT DOCUMENTS

| | | |
|---|---|---|
| CN | 101800423 A | 8/2010 |
| CN | 102403704 A | 4/2012 |
| CN | 202474847 U | 10/2012 |
| CN | 202695444 U | 1/2013 |
| CN | 203312790 U | 11/2013 |
| CN | 104779601 A | 7/2015 |
| CN | 104779607 A | 7/2015 |
| JP | 46080482 A | 9/1971 |
| JP | 49129853 A | 12/1974 |
| JP | 5234354 A | 3/1977 |
| JP | 2003189466 A | 7/2003 |
| TW | 200921900 A | 5/2009 |
| TW | 201315075 A | 4/2013 |

OTHER PUBLICATIONS

International Search Report and Written Opinion dated Apr. 28, 2016 for PCT/CN2015/086834 filed Aug. 13, 2015.

* cited by examiner

OVERVOLTAGE PROTECTION DEVICE

BACKGROUND

Field

Embodiments relate to the field of circuit protection devices, and more particularly to a semiconductor devices for protection against overvoltage events.

Discussion of Related Art

Semiconductor devices are widely used to provide protection against transient conditions, such as transient overvoltage events or surge events, by taking advantage of the properties of P/N junctions. In the present day there are two main type of discrete circuit protection technologies widely deployed in the market. These may be referred to as crowbar devices and clamping devices. Examples of clamping devices include varistors generally fabricated as metal oxide varistors (MOV), as well as Zener diodes. In either of these devices, voltage may be clamped to a level characteristic of the particular clamping device. A drawback of the use of a clamping device is the relatively slow response with a high clamping voltage, often 1.6 times to 2.5 times the standoff voltage. Additionally a high leakage current may be present in an MOV device and self-heat dissipation may accelerate aging and result in an MOV being unsuitable for withstanding multiple surge events. Crowbar type devices return to a lower voltage stage when a certain voltage is reached. One issue regarding the use of crowbar devices is that these devices do not return to a low leakage state in the absence of resetting, or until current through the device returns to a low level characteristic of their hold current.

It is with respect to these and other issues the present disclosure is provided.

SUMMARY

In one embodiment, an overvoltage protection device may include a metal oxide varistor (MOV) having a first surface and a second surface, a semiconductor substrate having a first outer surface and a second outer surface and comprising a semiconductor crowbar device comprising a plurality of semiconductor layers arranged in electrical series to one another, the semiconductor substrate being disposed on a first side of the metal oxide varistor; a conductive region disposed between the second surface of the MOV and the first outer surface of the semiconductor substrate; a first electrical contact disposed on the first surface of the MOV; and a second electrical contact disposed on the second outer surface of the semiconductor substrate.

In another embodiment, a method of fabricating an overvoltage protection device may include providing a metal oxide varistor (MOV) having a first side and a second side; attaching a first surface of a semiconductor substrate comprising a semiconductor crowbar device to the second side; forming a first electrical contact on the first side of the metal oxide varistor; and forming a second electrical contact on a second surface of the semiconductor substrate opposite the first surface, wherein the metal oxide varistor and the semiconductor crowbar device are in electrical series with one another between the first electrical contact and the second electrical contact.

In an additional embodiment, an overvoltage protection device may include a first electrical contact; a metal oxide varistor (MOV) electrically connected to the first electrical contact; a second electrical contact; and a semiconductor crowbar device comprising a plurality of semiconductor layers, wherein the metal oxide varistor and the semiconductor crowbar device are arranged in electrical series between the first electrical contact and second electrical contact.

DESCRIPTION OF EMBODIMENTS

Figure 1A:
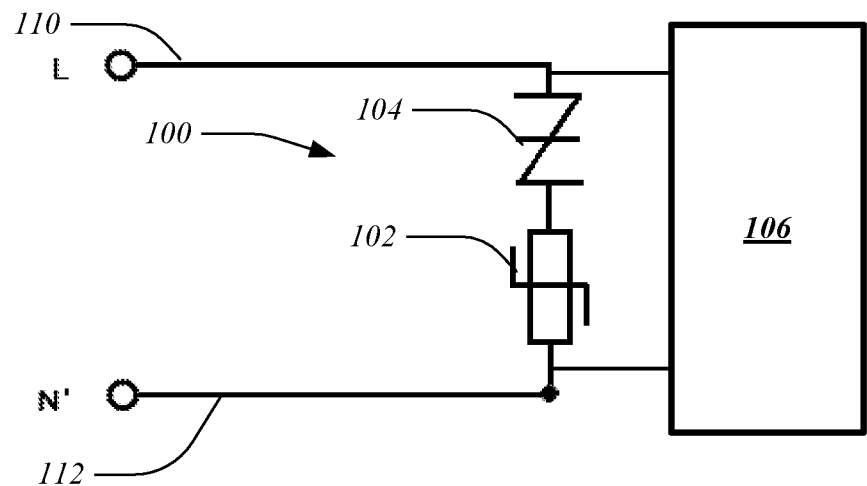
FIG. 1A presents a circuit representation of one implementation of an overvoltage protection device according to embodiments of the disclosure.

The present embodiments will now be described more fully hereinafter with reference to the accompanying drawings, in which various embodiments are shown. The embodiments may be embodied in many different forms and are not to be construed as limited to the embodiments set forth herein. These embodiments are provided so that this disclosure will be thorough and complete, and will fully convey the scope of the embodiments to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate when two or more elements are in direct physical contact with one another. The terms "on,", "overlying," "disposed on," and over, may also mean when two or more elements are not in direct contact with one another. For example, "over" may mean when one element is above another element and not in contact with another element, and may have another element or elements in between the two elements. Furthermore, the term "and/or" may mean "and", it may mean "or", it may mean "exclusive-or", may mean "one", may mean "some, not all", may mean "neither", and/or it may mean "both." The scope of claimed subject matter is not limited in this respect.

The present embodiments are generally related to overvoltage protection devices. In various embodiments, an overvoltage protection device may comprise an integration of a metal oxide varistor (MOV) with a semiconductor crowbar device. As detailed below, such a device may provide the advantages of a low clamping voltage, low leakage, and fast response time. The semiconductor crowbar component of the overvoltage protection devices of the present embodiments may provide excellent response to a surge, low leakage, durable protection while not wearing out, as well as accurate and consistent breakover voltage. The MOV component of such overvoltage protection devices may provide high energy clamping to respond to a surge. As used herein, the term "semiconductor crowbar device" may refer to a device that is implemented in a semiconductor substrate and acts to pull a voltage level down below a trigger level that is triggered in the event of an overvoltage condition. When implemented as a single device, the trigger level in a semiconductor crowbar device may be represented as a breakover voltage. When the breakover voltage is reached, the semiconductor crowbar device may enter an ON state and act to pull down the voltage to a level such as close to ground level. This action may be distinct from a clamping device such as a varistor, where voltage may be clamped to a clamping voltage where the varistor becomes electrically conducting. Examples of known semiconductor crowbar devices include thyristor type devices and a SIDACtor® type device (SIDACtor is a registered trademark of Littelfuse, Inc.).

In various embodiments an overvoltage protection device is provided that overcomes limitations of known MOV devices. In known MOV devices, for example, the clamping voltage may range from approximately 1.6 time to 2.5 times a working voltage. This may limit the ability of an MOV device to fully protect electronic equipment due to high energy that may be transmitted in the event of an overvoltage condition. In an overvoltage protection device arranged according to the present embodiments, a semiconductor crowbar component may be coupled to an MOV in a manner that acts as a high impedance switch during an off-state. This helps to lower overall leakage current.

FIG. 1A presents a circuit representation of one implementation of an overvoltage protection device according to embodiments of the disclosure. In particular, an overvoltage protection device 100 is implemented between a first electrical line 110 and second electrical line 112. The first electrical line 110 and second electrical line 112 may be coupled to an alternating current (AC) voltage source or a direct current DC voltage source.

In operation, the overvoltage protection device 100 may act to limit voltage whether coupled to a DC source or AC source. In the example of FIG. 1A, the overvoltage protection device 100 may protect a power circuit 106 by limiting the voltage or energy that passes through the power circuit 106 during an overvoltage event. In various embodiments the overvoltage protection device 100 may act as a bi-directional device that is a symmetrical device where the overvoltage protection device 100 provides a first current-voltage (I-V) characteristic in response to a positive external voltage that is the same as a second current-voltage characteristic in response to a negative external voltage.

In operation according to known principles, a bi-directional or symmetrical semiconductor crowbar device may provide an effective AC powerline protection. Under normal operation when AC voltage does not exceed a breakover voltage, such a semiconductor crowbar device does not turn on. When AC peak voltage or a surge transient voltage exceeds the breakover voltage, the semiconductor crowbar device may turn on, placing the semiconductor crowbar device in a low voltage ON state, triggering the external transient voltage to be diverted.

Since there is an AC coupling when the semiconductor crowbar device turns on, the short duration of AC rise cycle may go into the semiconductor protector. If this AC rise current does not exceed the maximum rated $I_{TSM}$ (non-repetitive peak on state current) value representing the single AC cycle current withstand capability, the semiconductor crowbar device may withstand the overvoltage condition while not experiencing any degradation. When the sinusoidal cycle goes to the negative voltage portion of a cycle, a zero crossing is experienced to reset the semiconductor crowbar device to an OFF-state, since the current decreases to below a value of the holding current of the semiconductor crowbar device. Thus, a semiconductor crowbar device may act as an AC line protection device to protect an AC transient surge as well as an AC coupling event. In the embodiments as shown in FIG. 1A, when a semiconductor crowbar device is coupled together with a metal oxide varistor (MOV) device, the resulting overvoltage protection device may form a very low clamping voltage bi-directional surge protection device.

Figure 1B:
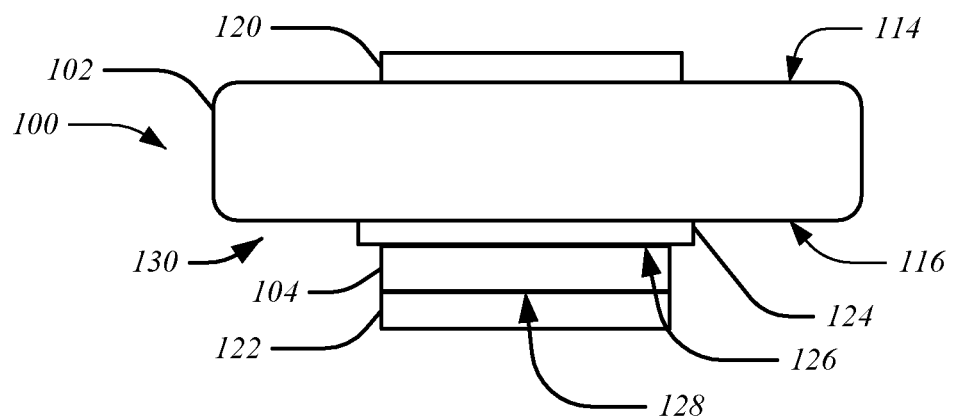
FIG. 1B presents a side cross-sectional view of a structure of an overvoltage protection device according to embodiments of the disclosure.

FIG. 1B presents a side cross-sectional view of a structure of an implantation of the overvoltage protection device 100 according to embodiments of the disclosure. As illustrated, the overvoltage protection device 100 may include the metal oxide varistor 102 and the semiconductor crowbar device 104. The metal oxide varistor 102 may include a first surface 114 and second surface 116. The metal oxide varistor 102 may be formed of any known MOV material according to known fabrication techniques. As detailed below, a semiconductor crowbar device of the present embodiments may include a plurality of semiconductor layers that are arranged in electrical series within a semiconductor substrate. As suggested in FIG. 1B the semiconductor crowbar device 104 may be implemented as a semiconductor substrate that has a first outer surface 126 and second outer surface 128. In this example the semiconductor crowbar device 104 (semiconductor substrate) is disposed on a first side 130 of the metal oxide varistor 102.

A conductive region 124 is disposed between the second surface 116 of the metal oxide varistor 102 and the first outer surface 126 of the semiconductor crowbar device 104. In different implementations as discussed below, the conductive region 124 may include a plurality of layers or components serving to electrically connect the metal oxide varistor 102 and semiconductor crowbar device 104. The conductive region 124 may be formed by applying at least one coat (coating) and may additionally include sheet metal or other metallic layer to provide electrical conductivity between the metal oxide varistor 102 and semiconductor crowbar device 104.

The overvoltage protection device 100 may further include a first electrical contact 120 disposed on the first surface 114 of the metal oxide varistor 102, and a second electrical contact 122 disposed on the second outer surface 128 of the semiconductor crowbar device 104. The first electrical contact 120 and second electrical contact 122 may be implemented as metallic pieces including a thin metallic plate or sheet made of material such as copper in one example. As shown in FIG. 1B, the metal oxide varistor 102 and semiconductor crowbar device 104 may accordingly be disposed in electrical series between the first electrical contact 120 and second electrical contact 122.

As detailed below in some implementations an overvoltage protection device according to various embodiments may include electrical leads (not shown in FIG. 1B) attached to the first electrical contact 120 and second electrical contact 122. This may allow for convenient handling and implementation as protection devices for circuits or electrical components. For example, it may be useful to encapsulate electrical components such as the semiconductor crowbar device 104 and metal oxide varistor 102 with an electrically insulating layer. The use of electrical leads may accordingly provide a convenient means to access the overvoltage protection device 100 when encapsulated by an electrical insulator.

Figure 2:
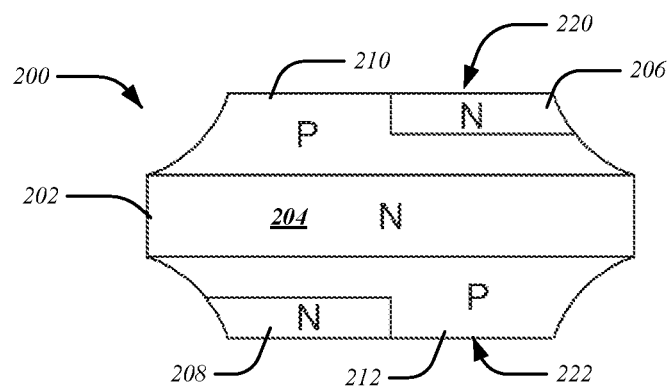
FIG. 2 presents a side cross-sectional view of a semiconductor crowbar device that may form part of an overvoltage protection device according to various embodiments.

FIG. 2 presents a side cross-sectional view of a semiconductor crowbar device 200 that may form part of an overvoltage protection device according to various embodiments. As illustrated the semiconductor crowbar device 200 is formed within a semiconductor substrate 202, such as monocrystalline silicon. The semiconductor substrate 202 may include an inner n-type layer 204, a first outer n-type layer 206, a second outer n-type layer 208, a first p-type layer 210 disposed between the first outer n-type layer 206 and inner n-type layer 204, and a second p-type layer 212 disposed between the second outer n-type layer 208 and inner n-type layer 204. In particular, the first n-type outer layer 208 may be disposed on a first outer surface 220 of the semiconductor substrate 202, while the second n-type outer layer 208 is disposed on a second outer surface 222 of the semiconductor substrate 202.

Although not shown in FIG. 2, to form an integrated overvoltage protection device according to various embodiments, the semiconductor substrate 202 may be implemented as the semiconductor crowbar device 104 of FIG. 1B. Thus, an MOV device may be disposed on one side of the semiconductor substrate 202, such as adjacent the first outer surface 220 or adjacent the second outer surface 222. For example, the MOV device and semiconductor substrate may be electrically coupled together as illustrated in FIG. 1B. In addition, electrical contacts may be formed on an outer surface of the semiconductor substrate 202 as well as on an outer surface of the MOV as also illustrated in FIG. 1B. In this manner, an MOV may be placed in electrical series with the various layers of the semiconductor crowbar device 200.

As further illustrated in FIG. 2, a first portion of the first p-type layer 210 may be disposed on the first outer surface 220 and a second portion of the second p-type layer 212 may be disposed on the second outer surface 222. A first external contact (not shown) to the first outer surface 220 of the crowbar device 200 may contact the first p-type layer 210 and the first outer n-type layer 206 in electrically parallel fashion. Likewise a second external contact to the second outer surface 222 of the crowbar device 200 may contact the second p-type layer 212 and the second outer n-type layer 208 in electrically parallel fashion. According to various embodiments, in response to an overvoltage event, the semiconductor crowbar device 200 may react similarly, not necessarily identically, to a known standalone semiconductor crowbar device. For example, the semiconductor crowbar device 200, when implanted in series with a metal oxide varistor, may exhibit a breakover voltage in response to an external voltage event. In particular, the semiconductor crowbar device 200 may be placed in an ON state when an external voltage experienced between the first outer surface 220 and second outer surface 222 equals or exceeds the breakover voltage, in accordance with known behavior of semiconductor crowbar devices.

Figures 3A, 3B:
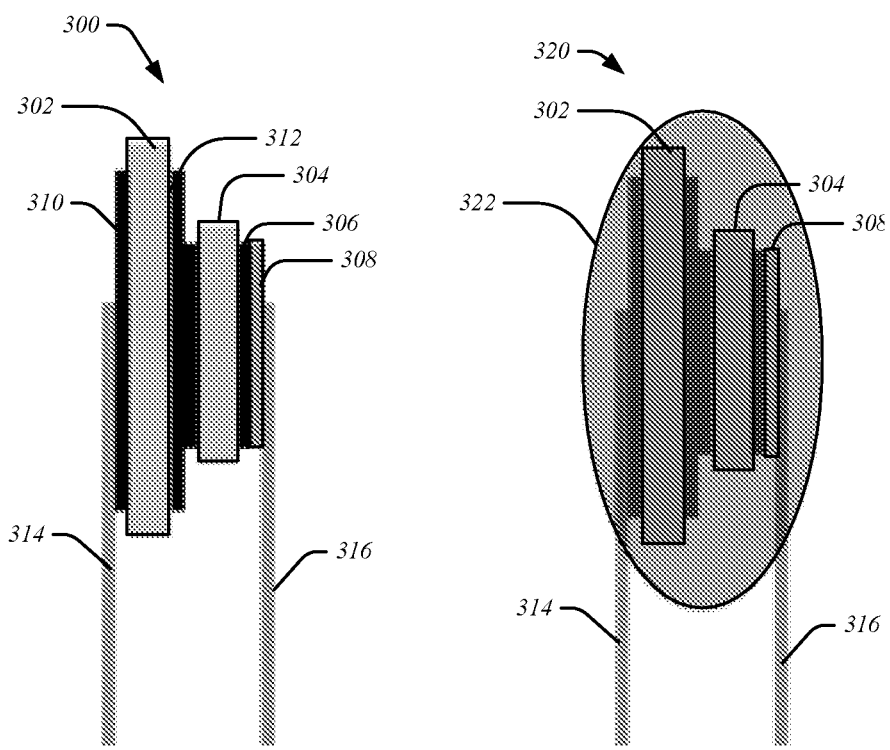
FIG. 3A depicts an overvoltage protection device before encapsulation according to some embodiments.
FIG. 3B depicts the overvoltage protection device of FIG. 3A after encapsulation.

FIG. 3A depicts an overvoltage protection device 300 according to some embodiments. In this example, the overvoltage protection device 300 is shown before encapsulation. The overvoltage protection device 300 may include a metal oxide varistor 302 arranged in electrical series with a semiconductor crowbar device 304. A conductive region 312 may be disposed between the metal oxide varistor 302 and semiconductor crowbar device 304 to electrically couple the metal oxide varistor 302 and semiconductor crowbar device 304. A conductive layer 306 may be disposed on an outer surface of the semiconductor crowbar device 304 as shown. An electrical contact 308 may be adjoined to the electrically conductive layer 306. An electrically conductive layer 310 may also be disposed on an outer surface of the metal oxide varistor 302. Additionally a first electrical lead 314 may be connected to the electrically conductive layer 310, while a second electrical lead 316 is connected to the electrical contact 308.

FIG. 3B depicts the overvoltage protection device of FIG. 3A after encapsulation, in this case represented as the overvoltage protection device 320. In this example, an electrically insulating coating 322 is disposed so as to encapsulate the metal oxide varistor 302 and semiconductor crowbar device 304. The overvoltage protection device 320 may thus be conveniently integrated into protection circuits for protecting target devices or other components by adjoining the first electrical lead 314 and second electrical lead 316 to different electrical lines that are placed at different potentials.

In various embodiments an overvoltage protection device may be arranged having a metal oxide varistor and semiconductor crowbar device, wherein the metal oxide varistor comprises a first standoff voltage, the semiconductor crowbar device comprises a second standoff voltage, and the overvoltage protection device comprises a total standoff voltage equal to a sum of the first standoff voltage and the second standoff voltage. The semiconductor crowbar device and metal oxide varistor may also be arranged to place the overvoltage protection device in an ON state when an external voltage exceeds a threshold value and further arranged to place the overvoltage protection device in an OFF state when the external voltage is below the threshold value.

Moreover, an overvoltage protection device may be arranged wherein the overvoltage protection device comprises a symmetrical device comprising a first current-voltage characteristic in response to a positive external voltage of a first magnitude applied between a first electrical contact and second electrical contact, and comprising a second current-voltage characteristic in response to a negative external voltage of the first magnitude applied between the first electrical contact and a second electrical contact, the second current-voltage characteristic matching the first current-voltage characteristic.

Figure 4A:
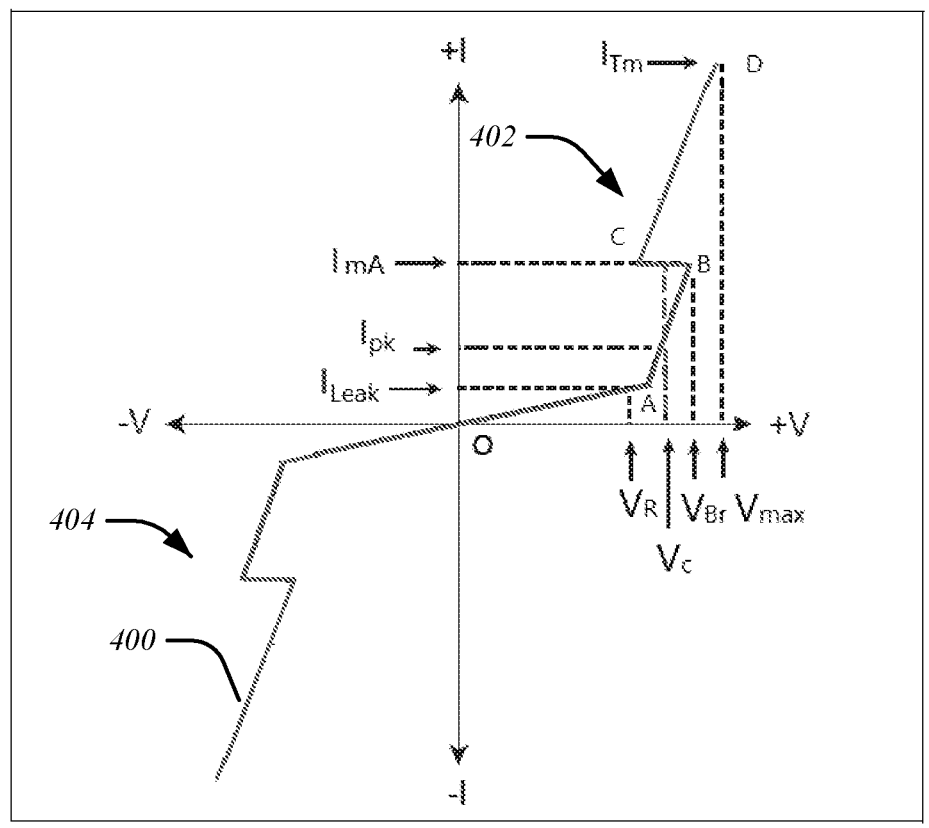
FIG. 4A presents an exemplary current-voltage curve for an overvoltage protection device according to embodiments of the disclosure.

FIG. 4A presents an exemplary current-voltage curve, shown as curve 400, for an overvoltage protection device according to embodiments of the disclosure. The curve 400 exhibits symmetrical behavior, including a positive voltage portion 402 and negative voltage portion 404. The embodiments are not limited in this context. The curve 400 results from the combined action of an overvoltage protection device, such as those depicted in the FIGS. 1A, 1B, 3A, and 3B. For example, referring also to FIG. 3B, when an external voltage is experienced between the first electrical lead 314 and second electrical lead 316, the resulting current that flows through a device such as overvoltage protection device 320, is shown by the curve 400. In particular the curve 400 is characterized by a breakover voltage $V_{BR}$. When the external applied voltage exceeds the $V_{BR}$ voltage as represented by point B, the voltage "folds back" to point C, where the overvoltage protection device clamps the external voltage to the level D representing the maximum clamping voltage. The breakover current ImA may be about 400 mA, characteristic of a semiconductor crowbar device. Notably, the curve 400 is characteristic of an integrated overvoltage protection that resets to an OFF state once the external voltage event subsides. In addition, the OFF state leakage current of the curve 400 has a much lower value due to the high impedance of the semiconductor crowbar device, in comparison a simple MOV device.

Figure 4B:
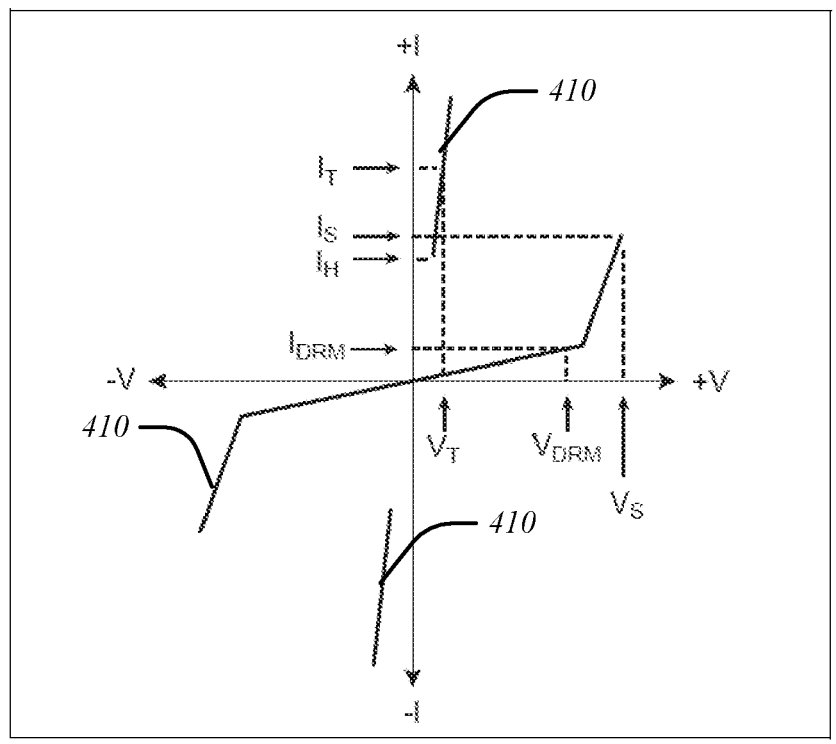
FIG. 4B presents an exemplary current-voltage curve for a first component of an overvoltage protection device.
Figure 4C:
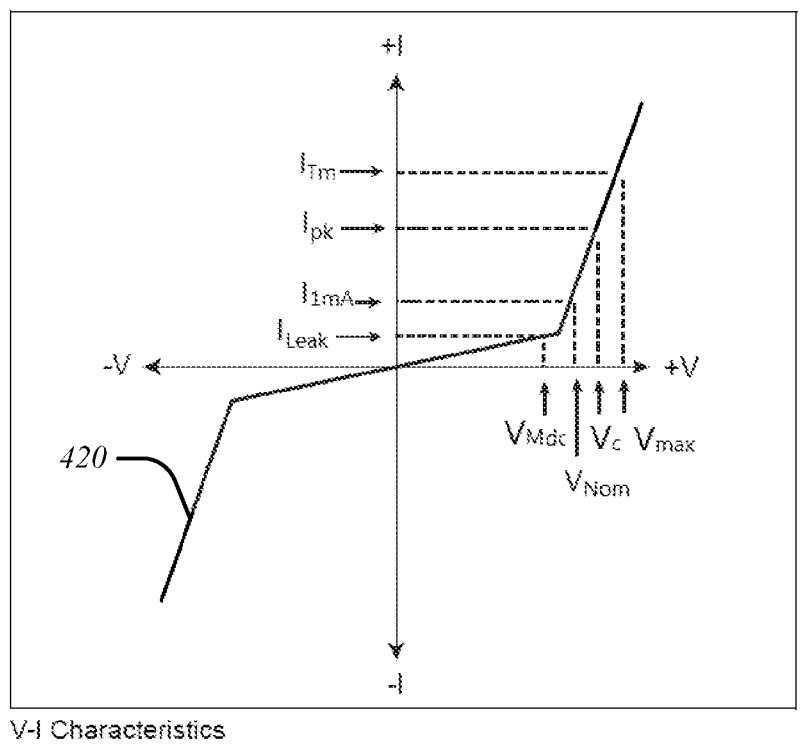
FIG. 4C presents an exemplary current-voltage curve for a second component of an overvoltage protection device.

By way of comparison, FIG. 4B presents an exemplary current-voltage curve, shown as curve 410, for a semiconductor crowbar device that may be used in an overvoltage protection device of the present embodiments. The curve 410 represents the current-voltage characteristic of a semiconductor crowbar device when implemented as a standalone component. In this example, when the external voltage reaches Vs the semiconductor crowbar device enters an ON state and voltage reduces to a low level. FIG. 4C presents an exemplary current-voltage curve, shown as curve 420, for an MOV device that may be used in an overvoltage protection device of the present embodiments. When external voltage reaches a value Vnom, the MOV device becomes conducting and voltage is clamped. Although not expressly shown in curve 400, the response time of an overvoltage protection device that includes an MOV and semiconductor crowbar device arranged in electrical series fashion between two electrical lines may act much faster than a standalone MOV in response to a transient voltage surge.

Table I. illustrates a comparison of experimental electrical data for an integrated overvoltage protection device of the present embodiments in comparison to a standalone MOV and standalone SIDACtor device. As illustrated, the device of the present embodiments improves clamping voltage from 850V to 492V in comparison to a standalone MOV. For leakage current (Idrm/Irrm), an improvement from 7.1 uA at 311 V for a standalone MOV to 0.25 uA at 311 V for a device of the present embodiments is measured. As observed in Table I. a standalone SIDACtor provides relatively low leakage and low clamping voltage for the same test conditions, while having a large AC follow-on current. AC Follow on current is a quantity characteristic of crowbar devices such as a SIDACtor. The rating for the follow on current for known SIDACtor devices ranges around the 230-270 A range (large). When a crowbar device (SIDACtor) is integrated with an MOV where the integrated device is clamping in nature, the integrated device exhibits a zero to a very small and short duration of follow current (less than 10 A). This almost zero AC follow on current is "absorbed" by the high impedance of the clamping device very quickly so the current subsides very quickly before builds up.

TABLE I

|  | VRMS | IDRM/IRRM (311 v) | Vclamp (Typ) | Ac follow on current |
|---|---|---|---|---|
| MOV | 220 v | 7.1 uA | 850 v | No |
| Present Embodiment | 220 v | 0.25 uA | 492 v | No/Small |
| SIDACtor | 220 v | 0.19 uA | <30 v | Large |

Figure 4D:
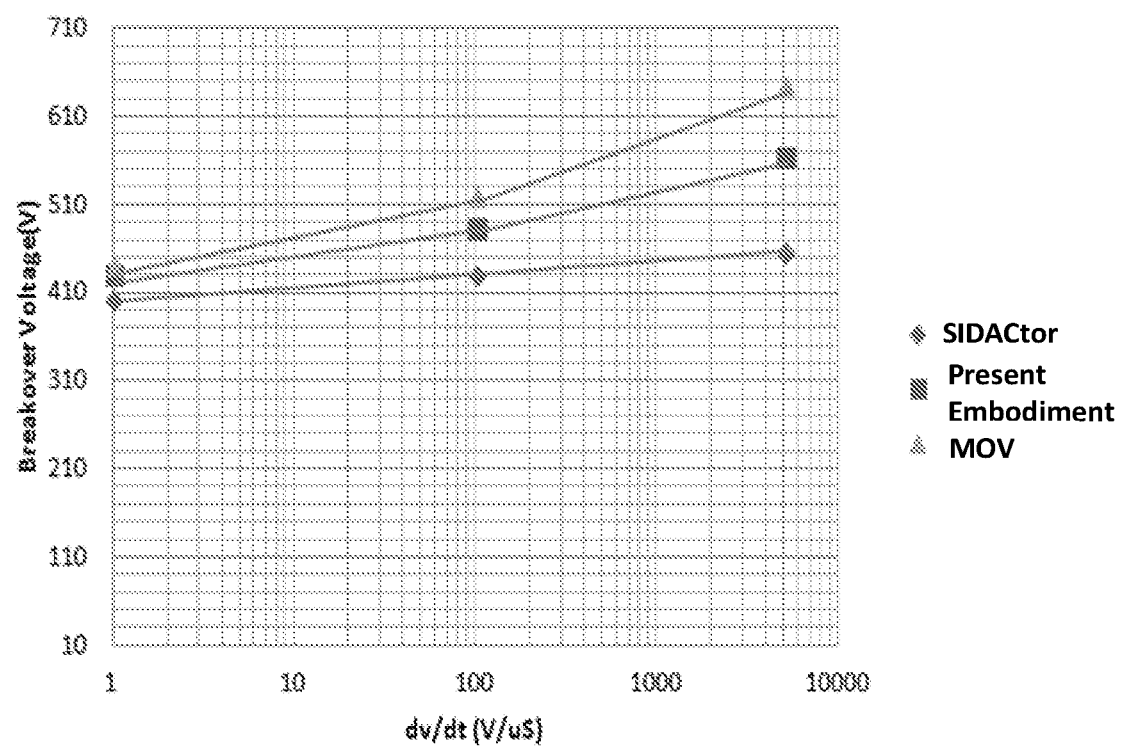
FIG. 4D presents an exemplary breakover voltage behavior comparing a device according to the present embodiments and standalone devices.

FIG. 4D presents an exemplary breakover voltage behavior comparing a device according to the present embodiments and standalone devices. As illustrated, the breakover voltage for a standalone SIDACtor, MOV, and device according to the present embodiments are plotted as a function of rate of change in voltage with time (dV/dT). As shown the SIDACTor standalone device shows a relatively flat response as a function of dV/dT, while the MOV breakover voltage is sensitive to dV/dT and increases dramatically above 100 V/μs, while the device according to the present embodiments shows an intermediate sensitivity of breakover voltage to dV/dT. Accordingly, the present embodiments provide a faster response to a voltage impulse than a conventional MOV device.

Figure 5:
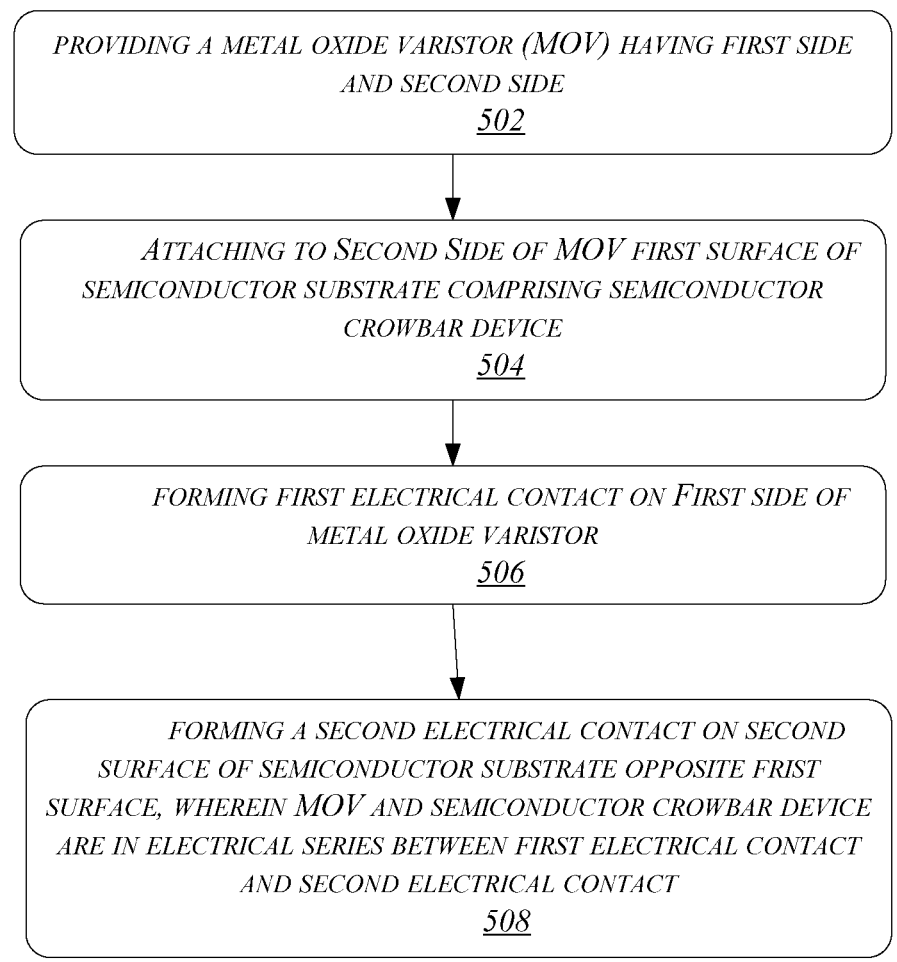
FIG. 5 presents an exemplary process flow.

FIG. 5 presents an exemplary process flow 500. The process flow 500 may be used for fabrication of an overvoltage protection device according to various embodiments of the disclosure. At block 502, a metal oxide varistor is provided where the metal oxide varistor has a first side and second side. The metal oxide varistor may be fabricated from known material according to know processing techniques. The metal oxide varistor (MOV) may have a planar structure having a target shape such as rectangular, circular, or elliptical. The embodiments are not limited in this context.

At block 504, a first surface of a semiconductor substrate is attached to the second side of the MOV. The semiconductor substrate may include a semiconductor crowbar device having multiple doped semiconductor layers. In some examples the semiconductor crowbar device may be fabricated within a monocrystalline silicon substrate. The first surface of the semiconductor substrate may be attached by applying an electrically conductive material on the second side of the MOV, on the first surface of the semiconductor substrate, or on the second side of the MOV and the first surface of the semiconductor substrate. In some examples multiple different electrically conductive components including a coating such as conductive solder paste, such as a low temperature solder paste, metallic sheet, and the like, may be used to attach the MOV to the semiconductor substrate.

At block 506, a first electrical contact is formed on the second side of the MOV, where the second side may be opposite the first side. The first electrical contact may include a metal sheet or plate, a conductive paste or other components.

At block 508, a second electrical contact is formed on a second surface of the semiconductor substrate opposite the first surface. The first electrical contact may include a metal sheet or plate, a conductive paste or other components. In this manner, the semiconductor crowbar device and MOV may be in electrical series with one another between the first electrical contact and the second electrical contact.

Figure 6A:
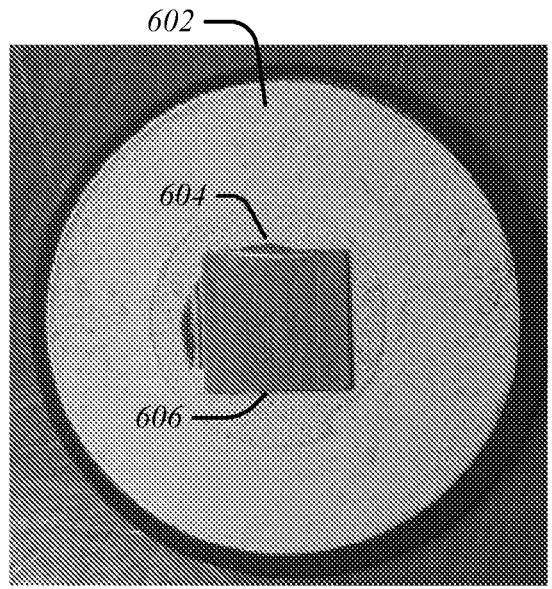
FIG. 6A to 6F presents a pictorial representation of an exemplary overvoltage protection device at various stages of fabrication according to embodiments of the disclosure.
Figure 6B:
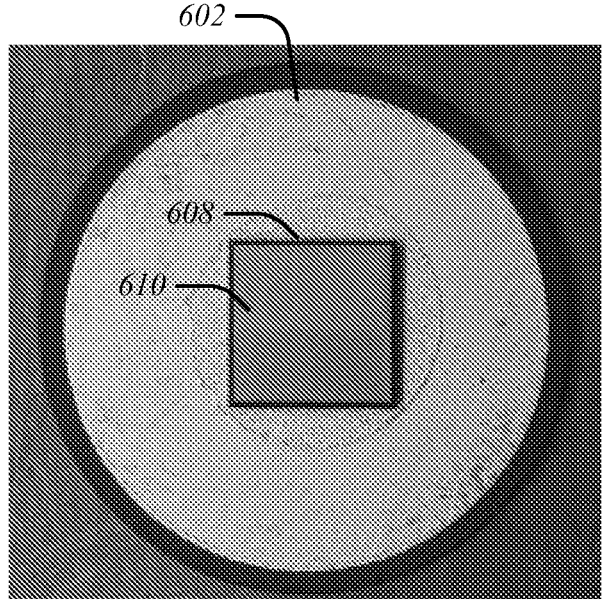
Figure 6C:
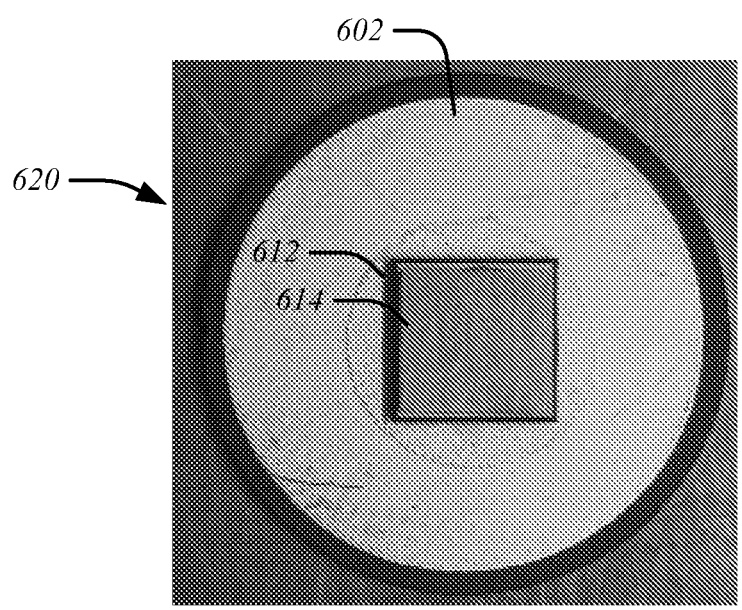

Turning now to FIGS. 6A to 6F there is shown a pictorial representation of an exemplary overvoltage protection device at various stages of fabrication, according to embodiments of the disclosure. In FIG. 6A to FIG. 6C a device is shown in plan view at early stages of fabrication. In FIG. 6A an MOV 602 is shown. The MOV 602 may have a circular shape in plan view, while other shapes are possible according to additional embodiments. A coat such as a conductive paste 604 may be applied to a surface of the MOV 602. Subsequently, a flat copper piece 606 (copper slug) may be applied to the conductive paste 604 as shown. The flat copper piece 606 may be formed from copper sheet, for example. The flat copper piece 606 may have an area that is smaller than the area of the MOV 602 as shown.

In FIG. 6B there is shown a subsequent stage when a conductive paste 608, which may be a solder paste, is applied to the outer surface of the flat copper sheet 606 away from the MOV 602. Subsequently, a semiconductor crowbar device 610 is attached to the conductive paste 608 as shown in FIG. 6B. The semiconductor crowbar device 610 may be embodied as a rectangular silicon chip having similar dimensions to the flat copper sheet 606.

In FIG. 6C there is shown a subsequent stage of fabrication where a conductive paste 612 may be applied to a surface of the semiconductor crowbar device 610. Subsequently, a flat copper piece 614 may be applied to the conductive paste 612 as shown. The flat copper piece 614 may have an area having similar dimensions to the semiconductor crowbar device 610. Together the components may form a device stack 620.

Subsequently the device stack 620 at the stage shown in FIG. 6C may be exposed to a low temperature anneal such as by hot air gun, where the temperature of hot air in the hot air gun is above room temperature. This low temperature anneal may promote bonding of the stack of components disposed on the MOV 602.

Figure 6D:
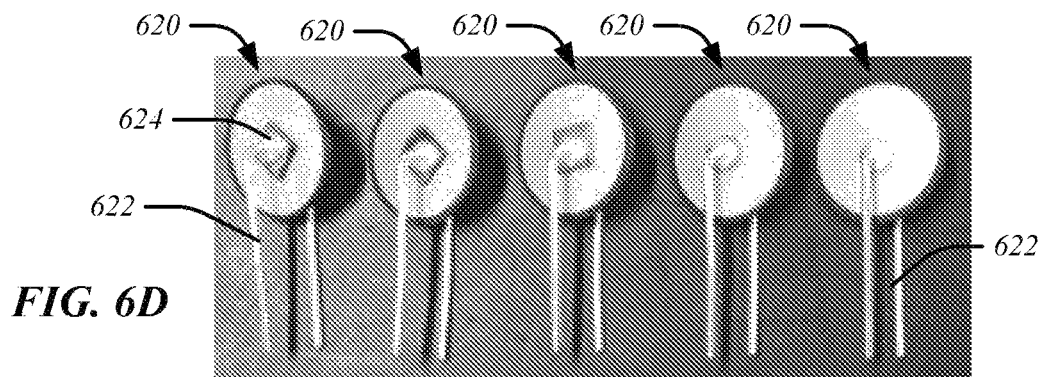

Turning now to FIG. 6D there is shown a top angled view of multiple overvoltage protection devices at a subsequent stage of fabrication. At this stage, a pair of electrical leads, shown as an electrical lead 622, may be attached to opposite sides of the device stack 620, as shown. In particular, a conductive paste 624 may be used to attach an electrical lead 622 to the flat copper piece 614. Another electrical lead may be similarly attached to the side of the MOV 602 opposite the side where the semiconductor crowbar device 610 is situated. In particular, the other electrical lead may be attached to the opposite side forming an unannealed device before the low temperature anneal.

Figure 6E:
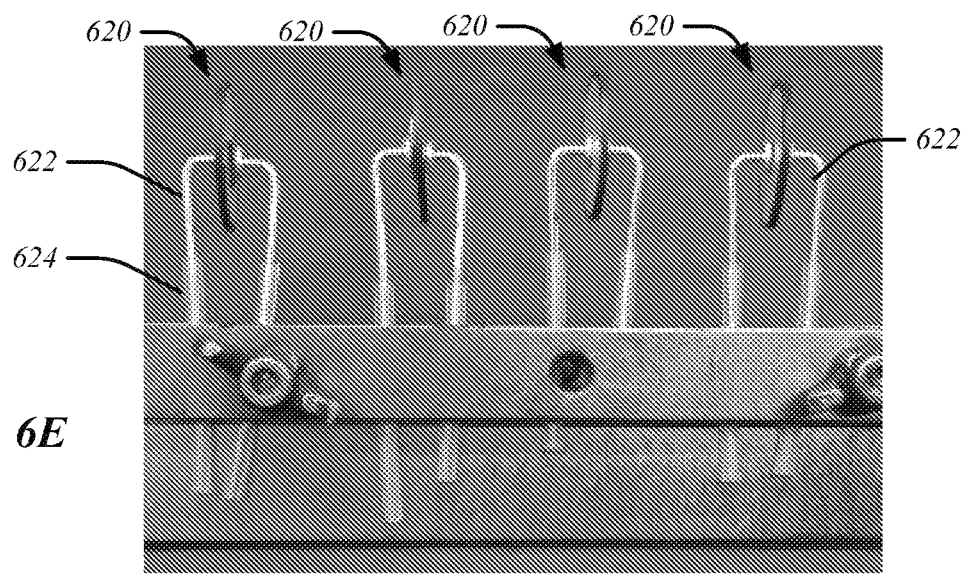
Figure 6F:
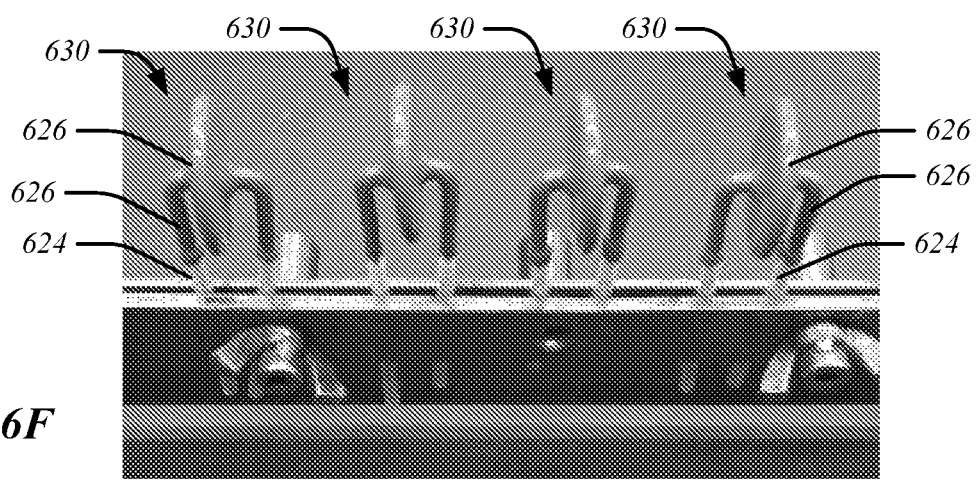

Turning now to FIG. 6E, there is shown a side view of the overvoltage protection device at a later stage where an insulating sleeve is arranged around an electrical lead 622. Finally, at FIG. 6F there is shown side view at a stage where an insulating coating 626, such as a plastic coating, is formed so as to encapsulate the device stack 620 as well as portions of electrical leads 622 adjacent the device stack 620. The insulating coating 626 may be formed by known methods for encapsulating varistors, for example. In one instance powder may be applied to the device stack and heat introduced to form a continuous coating.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments may not be limited to the described embodiments, and have the full scope defined by the language of the following claims, and equivalents thereof.

What is claimed is:

1. An overvoltage protection device, comprising:
a metal oxide varistor (MOV) having a first surface and a second surface;
a semiconductor substrate having a first outer surface and a second outer surface and comprising a semiconductor crowbar device comprising a plurality of semiconductor layers arranged in electrical series to one another, the semiconductor substrate being disposed on a first side of the metal oxide varistor;
a conductive region disposed between the second surface of the MOV and the first outer surface of the semiconductor substrate; a first electrical contact disposed on the first surface of the MOV; and
a second electrical contact disposed on the second outer surface of the semiconductor substrate;
wherein the semiconductor crowbar device comprises:
an inner n-type layer;
a first outer n-type layer disposed on the first outer surface;
a second outer n-type layer disposed on the second outer surface; a first p-type layer disposed between the first outer n-type layer and the inner n-type layer; and
a second p-type layer disposed between the second outer n-type layer and the inner n-type layer.

2. The overvoltage protection device of claim 1, wherein the metal oxide varistor and the semiconductor crowbar device are in electrical series between the first electrical contact and the second electrical contact.

3. The overvoltage protection device of claim 1, wherein the metal oxide varistor comprises a first standoff voltage, the semiconductor crowbar device comprises a second standoff voltage, and the overvoltage protection device comprises a total standoff voltage equal to a sum of the first standoff voltage and the second standoff voltage.

4. The overvoltage protection device of claim 1, wherein the metal oxide varistor comprises a first response time as a standalone device, and wherein the overvoltage protection device comprises a second response time less than the first response time.

5. The overvoltage protection device of claim 1 wherein the metal oxide varistor comprise a first leakage current at a first voltage as a standalone device, and wherein the overvoltage protection device comprises a second leakage current at the first voltage that is less than the first leakage current.

6. The overvoltage protection device of claim 1, the semiconductor crowbar device and metal oxide varistor arranged to place the overvoltage protection device in an ON state when an external voltage exceeds a threshold value and further arranged to place the overvoltage protection device in an OFF state when the external voltage is below the threshold value.

7. The overvoltage protection device of claim 1, wherein a first portion of the first p-type layer is disposed on the first outer surface and a second portion of the second p-type layer is disposed on the second outer surface.

8. The overvoltage protection device of claim 1, wherein the conductive region comprises:
a first conductive layer disposed on the second surface of the metal oxide varistor;
a second conductive layer disposed on the first outer surface of the semiconductor substrate; and
a first copper slug disposed between the first conductive layer and the second conductive layer.

9. The overvoltage protection device of claim 1, wherein the second electrical contact comprises: a third conductive layer disposed on the second outer surface of the semiconductor substrate; and a second copper slug disposed on the third conductive layer.

10. The overvoltage protection device of claim 1, wherein the overvoltage protection device comprises a symmetrical device comprising a first current-voltage characteristic in response to a positive external voltage of a first magnitude applied between the first electrical contact and second electrical contact, and comprising a second current-voltage characteristic in response to a negative external voltage of the first magnitude applied between the first electrical contact and second electrical contact, the second current-voltage characteristic matching the first current-voltage characteristic.

11. A method of fabricating an overvoltage protection device, comprising:

providing a metal oxide varistor (MOV) having a first side and a second side;

attaching a first surface of a semiconductor substrate comprising a semiconductor crowbar device to the second side;

forming a first electrical contact on the first side of the metal oxide varistor; and forming a second electrical contact on a second surface of the semiconductor substrate opposite the first surface, wherein the metal oxide varistor and the semiconductor crowbar device are in electrical series with one another between the first electrical contact and the second electrical contact;

wherein the semiconductor crowbar device comprises:
an inner n-type layer;
a first outer n-type layer disposed on the first outer surface;
a second outer n-type layer disposed on the second outer surface; a first p-type layer disposed between the first outer n-type layer and the inner n-type layer; and
a second p-type layer disposed between the second outer n-type layer and the inner n-type layer.

12. The method of claim 11, wherein the attaching comprises:
applying a first coat comprising a low temperature solder paste to a first surface of the metal oxide varistor (MOV);
attaching a first metallic piece to the first coat;
applying a second coat comprising the low temperature solder paste to the first metallic piece; and
attaching the semiconductor substrate to the second coat.

13. The method of claim 11, wherein the forming the second electrical contact comprises:
applying a third coat comprising a low temperature solder paste to the semiconductor substrate; and attaching a second metallic piece to the third coat to form an unannealed device.

14. The method of claim 13, further comprising applying hot air to the unannealed device at a first temperature.

15. The method of claim 13, further comprising:
attaching a first electrical lead to the first side of the metal oxide varistor; and
attaching a second electrical lead to the second metallic piece.

16. The method of claim 11, further comprising:
applying a plastic coating to the semiconductor substrate, the metal oxide varistor, the first electrical contact, and the second electrical contact.

17. An overvoltage protection device, comprising:
a first electrical contact; a metal oxide varistor (MOV) electrically connected to the first electrical contact;
a second electrical contact; and
a semiconductor crowbar device comprising:
an inner n-type layer;
a first outer n-type layer disposed on the first outer surface;
a second outer n-type layer disposed on the second outer surface; a first p-type layer disposed between the first outer n-type layer and the inner n-type layer; and
a second p-type layer disposed between the second outer n-type layer and the inner n-type layer,
wherein the metal oxide varistor and the semiconductor crowbar device are arranged in electrical series between the first electrical contact and second electrical contact.

* * * * *